United States Patent [19]

Sato et al.

[11] Patent Number: 4,520,289
[45] Date of Patent: May 28, 1985

[54] DRIVE CIRCUIT FOR A PIEZO-ELECTRIC ELEMENT

[75] Inventors: Ryuichi Sato; Tsutomu Taniguchi, both of Kyoto; Masatoshi Ohba, Nagaokakyo, all of Japan

[73] Assignee: Omron Tateisi Electronics Co., Kyoto, Japan

[21] Appl. No.: 615,908

[22] Filed: May 31, 1984

[30] Foreign Application Priority Data

Jun. 1, 1983 [JP] Japan .............................. 58-84536[U]

[51] Int. Cl.$^3$ ............................................. H01L 41/08
[52] U.S. Cl. .................................... 310/316; 310/317; 310/332
[58] Field of Search ............... 310/316, 317, 319, 326, 310/330–332; 318/116, 118; 331/116 R, 146, 151, 154, 158, 160

[56] References Cited

U.S. PATENT DOCUMENTS

| 3,967,143 | 6/1976 | Watanabe et al. | 310/316 |
| 4,093,885 | 6/1978 | Brown | 310/316 X |
| 4,109,174 | 8/1978 | Hodgson | 310/316 |
| 4,168,447 | 9/1979 | Bussiere | 310/316 |
| 4,256,987 | 3/1981 | Takeuchi et al. | 310/316 |
| 4,263,527 | 4/1981 | Comstock | 310/316 |

Primary Examiner—Mark O. Budd
Attorney, Agent, or Firm—Cushman, Darby & Cushman

[57] ABSTRACT

A drive circuit for a piezo-electric element includes a blocking oscillator circuit which has a booster transformer with primary and secondary windings, an oscillation transistor the collector of which is connected to the primary winding of the booster transformer, and a biasing circuit via which a signal at the secondary winding of the booster transformer is fed back to the base of the oscillation transistor so as to produce oscillation by positive feedback. This drive circuit also includes an electric current control circuit means for restricting electric current from flowing through the oscillation transistor when the voltage at the secondary winding of the booster transformer has become equal to or greater than a certain value, and a rectifying element through which the piezo-electric element is connected to the secondary winding of the booster transformer. Optionally, there may be further included a discharge transistor means for rapidly discharging electric charge stored in the piezo-electric element when power input to the blocking oscillator circuit is discontinued. This drive circuit may be used in a relay for driving a piezo-electric element which makes and/or breaks contacts for connecting and/or breaking switched circuits.

8 Claims, 4 Drawing Figures

DRIVE CIRCUIT FOR A PIEZO-ELECTRIC ELEMENT

BACKGROUND OF THE INVENTION

The present invention relates to a drive circuit for a piezo-electric element, and in particular to a drive circuit for a piezo-electric element which can provide stable drive voltage to said piezo-electric element and also a fast response.

The use of a piezo-electric element as a means for converting electric power into mechanical power has been known from the past. For instance, such a piezo-electric element may be conveniently used as a drive means in a relay. This is convenient, since a piezo-electric element is simpler in structure and requires less power than a more conventional electromagnetic solenoid.

However, since a piezo-electric element requires a relatively high drive voltage, a special power source therefor which can supply a sufficiently high voltage is required. When such a high voltage is not directly available, a drive circuit which can boost up the drive voltage to the required high level is required.

FIG. 1 of the accompanying drawings is an electric circuit diagram of a conventional drive circuit for a piezo-electric element. A voltage supplied from a DC power source E is supplied to a blocking oscillator H which produces an output consisting of alternating current of a higher voltage. The output of the blocking oscillator circuit H is rectified by a diode D3 and then supplied to a piezo-electric element P.

This drive circuit can provide the voltage required for driving the piezo-electric element P, but has the following shortcomings:

Although the drive circuit is provided with a zener diode ZD1 for stabilizing the input voltage to the blocking oscillator circuit H, fluctuation in the voltage of the power source E still affects the blocking oscillator circuit H and causes changes in the output voltage. The piezo-electric element P normally has a permissible range of drive voltage which may be applied thereto. If the output voltage of the blocking oscillator circuit H is too low then the piezo-electric element P may not deform enough for its function, while if this output voltage is too high it may damage the piezo-electric element P and thereby reduce its reliability.

Also, when the piezo-electric element P is to be deactivated, the electric charges stored in the element must be discharged to ensure its restoration to the deactivated state. A resistor R2 is provided for this electric discharge function, and the resistance of this resistor R2 determines the time constant of the discharge circuit for the piezo-electric element P. Therefore, the smaller the value of the resistor R2, the faster the piezo-electric element P can perform its function. On the other hand, since the resistor R2 is connected in parallel with the piezo-electric element, it has the effect of being a dead load for the blocking oscillator circuit H when the piezo-electric element P is being activated, and thus increases the overall power consumption.

SUMMARY OF THE INVENTION

Accordingly, it is the primary object of the present invention to provide a drive circuit for a piezo-electric element, which requires relatively low voltage for its operation and which is free from the influence of changes in the voltage of the power source.

It is a further object of the present invention to provide such a drive circuit for a piezo-electric element, which consumes less power than do conventional drive circuits for such a piezo-electric element.

It is a yet further object of the present invention to provide such a drive circuit for a piezo-electric element, which is suitable for use for driving a relay which uses a piezo-electric element as a drive means thereof.

According to the most general aspect of the present invention, these and other objects are accomplished by, for a piezo-electric element: a drive circuit, comprising: (a) a blocking oscillator circuit comprising a booster transformer with primary and secondary windings, an oscillation transistor the collector of which is connected to the primary winding of said booster transformer, and a biasing circuit via which a signal at the secondary winding of said booster transformer is fed back to the base of said oscillation transistor so as to produce oscillation; (b) an electric current control circuit means for restricting electric current from flowing through said oscillation transistor when the voltage at the secondary winding of said booster transformer has become equal to or greater than a certain value; and (c) a rectifying element through which said piezo-electric element is connected to the secondary winding of said booster transformer.

According to such a structure, when the voltage at said secondary winding of said booster transformer becomes equal to or greater than said certain value, then the positive feedback causing said oscillation via the operation of said oscillation transistor is curtailed, and therefore the output voltage at said secondary winding of said booster transformer which is being supplied via said rectifying element to said piezo-electric element is kept down, thus not only assuring that damage to said piezo-electric element caused by too high voltage greater than its permissible voltage range being supplied thereto is positively prevented but also power utilization is economized, thus saving energy and reducing drain on the source of power for this drive circuit.

Further, according to a more particular aspect of the present invention, these and other objects are more particularly and concretely accomplished by such a drive circuit for a piezo-electric element as described above, further comprising a discharge transistor means for rapidly discharging electric charge stored in said piezo-electric element when power input to said blocking oscillator circuit is discontinued.

According to such a structure, when the piezo-electric element is to be deactivated, and thus the electric charges stored in the element must be discharged to ensure its restoration to the deactivated state, the power input to the blocking oscillator circuit is discontinued, and thus the electric charges stored in the piezo-electric element are rapidly discharged through this discharge transistor means.

BRIEF DESCRIPTION OF THE DRAWINGS

The present invention will now be shown and described with reference to the preferred embodiment thereof, and with reference to the illustrative drawings. It should be clearly understood, however, that the description of the embodiment, and the drawings, are given purely for the purposes of explanation and exemplification only, and are not intended to be limitative of the scope of the present invention in any way. In the drawings, like parts and features are denoted by like reference symbols in the various figures thereof, and.

DESCRIPTION OF THE PREFERRED EMBODIMENT

Figure 2:
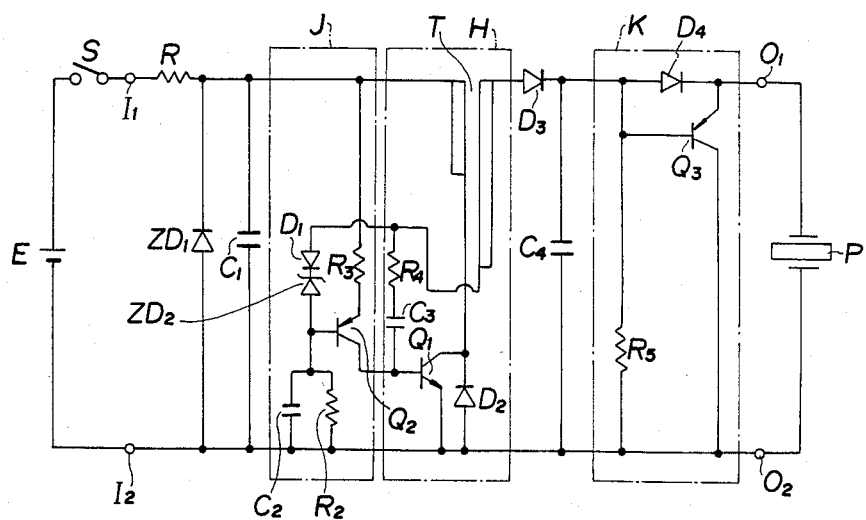
FIG. 2 is an electric circuit diagram showing the preferred embodiment of the drive circuit for a piezo-electric element according to this invention.

The present invention will now be described with reference to the preferred embodiment thereof, and with reference to the appended drawings. FIG. 2 shows this preferred embodiment of the drive circuit for a piezo-electric element according to this invention. Referring to this figure, a DC power source E is connected and supplies DC power to a stabilizer circuit comprising the series connection of a resistor R1 and a zener diode ZD1, by way of a switch S and terminals I1 and I2. The voltage stablized output of the stabilizer circuit is connected to a current controller circuit J which is connected to the input of a blocking oscillator circuit H. A capacitor C1 connected across the input of the current controller circuit J is for preventing ripples produced in the blocking oscillator circuit H from flowing back to the input.

The output of the blocking oscillator circuit H is rectified into a DC voltage by a diode D3 and this DC voltage is smoothed by a capacitor C4. The smoothed DC output is then supplied to a piezo-electric element P by way of a discharge circuit K and terminals 01 and 02.

The blocking oscillator circuit H comprises an oscillation transistor Q1 (which is a NPN transistor) and a booster transformer T. The primary winding of the booster transformer T is connected to the collector of the oscillation transistor Q1 at its one end and to the positive side of the power source E, by way of the switch S, at its other end. The secondary winding of the booster transformer T is connected to the anode of the rectifying diode D3 at its one end and to the base of the oscillation transistor Q1 by way of the series connection of a resistor R4 and a capacitor C3 at its other end. The emitter of the oscillation transistor Q1 is connected to ground. A diode D2 grounding the collector of the oscillation transistor Q1 thereby is provided for protecting the transistor Q1 from the counter-electromotive force of the boosting transformer T.

The current controller circuit J comprises a transistor Q2 (which is a PNP transistor). The emitter of the transistor Q2 is connected to the positive side of the power source E by way of a emitter follower resistor R3 and the switch S, while the collector of the transistor Q2 is directly connected to the base of the oscillation transistor Q1. The base of the transistor Q2 is grounded by the parallel connection of a capacitor C2 and a resistor R2, and is also connected to the other end of the secondary winding of the booster transformer T by way of the series connection of a zener diode ZD2 and a diode D1.

The discharge circuit K comprises a discharge transistor Q3 (which is a PNP transistor). The base of the discharge transistor Q3 is directly connected to the cathode of the diode D3 and is also grounded via a resistor R5, while the collector of the discharge transistor Q3 is direcly connected to ground. The emitter of the discharge transistor Q3 is connected to the base of the discharge transistor Q3 by way of a diode D4 and is directly connected to the piezo-electric element P by way of the output terminal 01. The resistor R5 and the diode D4 are provided for forward biasing the emitter-base junction of the discharge transistor Q3 with the electric current supplied from the piezo-electric element P when it discharges.

When the switch S is closed, a certain voltage is applied to the base of the oscillation transistor Q1 by way of the resistor R3 and the transistor Q2, and the oscillation transistor Q1 is turned on, thus causing electric current to flow through the primary winding of the booster transformer T. Since the other end of the secondary winding of the booster transformer T is connected to the base of the oscillation transistor Q1 by way of the resistor R4 and C3 so as to provide a positive feedback effect, the oscillation transistor Q2 cyclically turns on and off at a frequency which is determined by the time constant defined by the resistor R4 and the capacitor C4. So far the action of the blocking oscillator circuit H is conventional.

Now, according to this invention, when the output voltage on the secondary winding of the booster transformer T has reached a predetermined value, the zener diode ZD2 limits the biasing voltage of the transistor Q2 to a fixed level, and the biasing voltage of the oscillation transistor Q1 is limited to a fixed level, thereby limiting the output voltage of the secondary winding of the booster transformer T to a certain limit.

Figure 1:
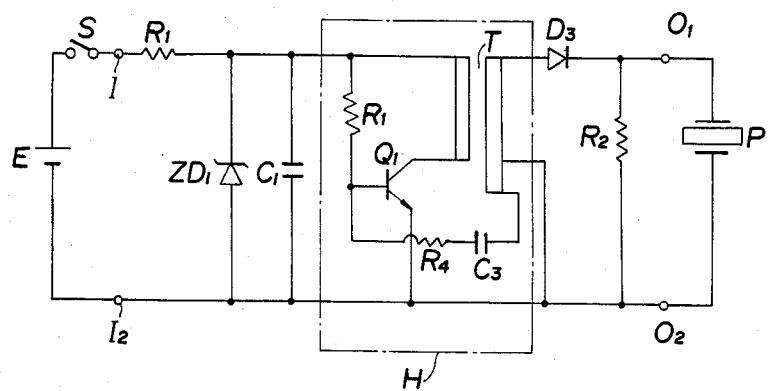
FIG. 1 is an electric circuit diagram showing a prior art type drive circuit for a piezo-electric element.
Figure 3:
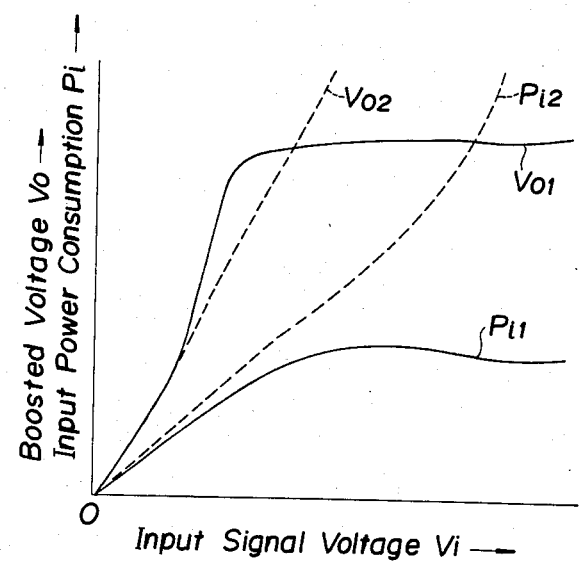
FIG. 3 is a graph showing relationships between the input voltage and the output voltage and between the input voltage and the input power consumption both in the drive circuit for a piezo-electric element according to this invention and in the conventional art, respectively.

As shown in the graph of FIG. 3, when there is no current control circuit J as in the case of the conventional drive circuit shown in FIG. 1, as the input voltage Vi increases, both the output voltage Vo2 and the power consumption Pi2 of the drive circuit increase simply and substantially in proportion with the increase in the input voltage Vi as shown by the dashed line curves, but on the other hand, when such a current control circuit J is provided according to the drive circuit of this invention, both the output voltage Vo1 and the power consumption Po1 do not increase substantially beyond certain limits no matter how much the input voltage Vi is increased, as shown by the solid line curves.

Since the output voltage is limited to a certain level, the magnetic flux in the booster transformer T does not saturate and loss of power in the booster transformer T is avoided and the piezo-electric element P is definitely never damaged by application of excessive voltage.

When the switch S is closed and the blocking oscillator H is activating the piezo-electric element P, the discharge transistor Q3 is reverse biased and acts as an high impedance element, while the diode D4 permits the application of the output voltage to the piezo-electric element P. However, when the switch S is opened and the blocking oscillator circuit H has ceased to produce the high voltage output, the discharge transistor Q3 is forward biased by the electric current supplied from the piezo-electric element P as it discharges.

Thus, since the electric discharge from the piezo-electric element P is made through the discharge transistor Q3 which provides a low impedance passage to ground as seen from the piezo-electric element P with the discharge transistor Q3 biased forward, the piezo-electric element P can return to its deactivated state very quickly. And, since the dead load as seen from the output of the blocking oscillator circuit H consists of the resistor R5 which may have a relatively high value, the loss of power in the discharge circuit K is minimized. By selecting a discharge transistor Q3 having a large $h_{fe}$ value, this resistance value of the base resistor R5 may be made great.

Figure 4:
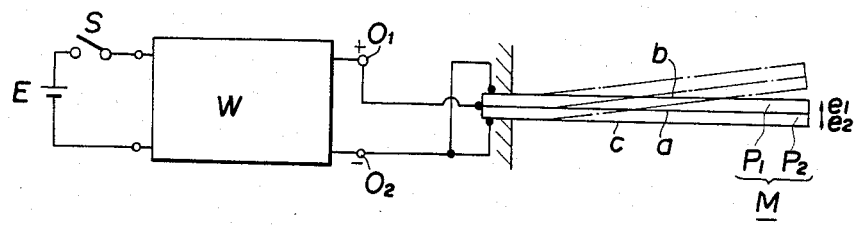
FIG. 4 is a schematic view showing an application of the drive circuit for a piezo-electric element according to this invention.

FIG. 4 shows an exemplary application of the drive circuit for a piezo-electric element according to this invention. Such a drive circuit W according to the present invention which is connected to a power source E by way of the switch S is used for driving a bimorphic element M connected to the terminals 01 and 02. This bimorphic element M comprises a pair of piezo-electric elements P1 and P2 which are attached together so that their polarization directions both extend along their depths or their thicknesses. And the positive terminal 01 of the output of the drive circuit W is connected to an intermediate electrode a of the bimorphic element M which is common to both of the piezo-electric elements P1 and P2, while the negative terminal 02 is connected to the surface terminals b and c of the bimorphic element M.

Therefore, when the switch S is closed, the piezo-electric element P1 which is subjected to an electric field of the same direction as its polarization direction e1 contracts while the piezo-electric element P2 which is subjected to an electric field of the opposite direction to its polarization direction e2 extends. As a result, the bimorphic element M which is supported in a cantilever fashion undergoes a deflection as shown by the dash-dotted lines in FIG. 4, and, either by way of a connecting piece not shown in the drawing or directly, a movable contact piece of a relay may be activated either for making a contact with a fixed contact piece or for disengaging a contact from the fixed contact piece.

Thus, since the drive circuit W may be made very small, it may be conveniently incorporated into a relay using a piezo-electric element as its drive means. Since such a relay may be operated by a small voltage and provide high reliability in addition to being very compact, it may be used for a wide range of applications where the use of a relay is desirable.

Although the present invention has been shown and described with reference to a preferred embodiment thereof, and in terms of the illustrative drawings, it should not be considered as limited thereby. Various possible modifications and alterations could be conceived of by one skilled in the art to the form and the content of any particular embodiment. Therefore it is desired that the scope of the present invention, and of the protection sought to be granted, should be defined not by any of the perhaps purely fortuitous details of the shown preferred embodiment or of the drawings, but solely by the scope of the appended claims, which follow.

What is claimed is:
1. For a piezo-electric element:
a drive circuit, comprising:

(a) a blocking oscillator circuit comprising a booster transformer with primary and secondary windings, an oscillation transistor the collector of which is connected to the primary winding of said booster transformer, and a feedback circuit via which a signal at the secondary winding of said booster transformer is fed back to the base of said oscillation transistor so as to produce oscillation;

(b) an electric current control circuit means for restricting electric current from flowing through said oscillation transistor when the voltage at the secondary winding of said booster transformer has become equal to or greater than a certain value; and (c) a rectifying element through which said piezo-electric element is connected to the secondary winding of said booster transformer.

2. A drive circuit for a piezo-electric element, according to claim 1, further comprising a discharge transistor means for rapidly discharging electric charge stored in said piezo-electric element when power input to said blocking oscillator circuit is discontinued.

3. A drive circuit for a piezo-electric element, according to claim 1, wherein said electrical current control circuit means comprises a control transistor whose collector is connected to said base of said oscillation transistor and a series connection of a diode and a zener diode, said series connection being connected between the base of said control transistor and said secondary winding of said booster transformer.

4. A drive circuit for a piezo-electric element, according to claim 1, wherein said feedback circuit comprises a series connection of a resistor and a condenser, said series connection being connected between said secondary winding of said booster transformer and said base of said oscillation transistor.

5. A drive circuit for a piezo-electric element, according to claim 4, wherein said oscillation transistor is a NPN transistor.

6. A drive circuit for a piezo-electric element, according to claim 3, wherein said oscillation transistor is a NPN transistor and said control transistor is a PNP transistor.

7. A drive circuit for a piezo-electric element, according to claim 2, wherein said discharge transistor means comprises a diode through which current is supplied to said piezo-electric element, a resistor, and a PNP transistor whose emitter and collector are connected between the terminals of said piezo-electric element and whose base is connected to one of said terminals of said piezoelectric element via said resistor and to the other of said terminals of said piezo-electric element via said diode.

8. A relay comprising a bimorphic piezo-electric element comprising two piezo-electric subelements layered together and a drive circuit according to claim 1, an intermediate electrode of the bimorphic element which is common to both of the piezo-electric subelements being connected to one output of said drive circuit, while two surface terminals of the bimorphic element which are connected each to one of said piezo-electric subelements are connected to the other output of said drive circuit.

* * * * *